United States Patent [19]

Lee

[11] Patent Number: 5,770,957
[45] Date of Patent: Jun. 23, 1998

[54] SIGNAL GENERATOR FOR GENERATING SENSE AMPLIFIER ENABLE SIGNAL

[75] Inventor: Kyu-chan Lee, Seoul, Rep. of Korea

[73] Assignee: Samsung Electronics Co., Ltd., Suwon, Rep. of Korea

[21] Appl. No.: 825,227

[22] Filed: Mar. 19, 1997

[30] Foreign Application Priority Data

Aug. 30, 1996 [KR] Rep. of Korea ............... 1996-37221

[51] Int. Cl.⁶ .............................. H03B 1/00; G11C 7/06
[52] U.S. Cl. .............................................. 327/109; 327/51
[58] Field of Search ................................... 327/109, 108, 327/51–57; 365/185.21, 189.05

[56] References Cited

U.S. PATENT DOCUMENTS

| | | | |
|---|---|---|---|
| 4,003,035 | 1/1977 | Hoffman et al. | 327/51 |
| 5,384,736 | 1/1995 | Jung et al. | 327/51 |
| 5,506,524 | 4/1996 | Lin | 327/57 |
| 5,623,446 | 4/1997 | Hisada et al. | 327/589 |
| 5,646,905 | 7/1997 | Pogrebnoy | 365/230.01 |
| 5,675,535 | 10/1997 | Jinbo | 365/185.2 |
| 5,701,268 | 12/1997 | Lee et al. | 365/205 |

*Primary Examiner*—Toan Tran
*Attorney, Agent, or Firm*—Jones & Volentine, L.L.P.

[57] ABSTRACT

A signal generator produces enable signals for bitline sense amplifiers in a semiconductor device. The signal generator includes a first driving element for producing a first enable signal at a first output line in response to first and second control signals, a second driving element for producing a second enable signal at a second output line in response to inverted signals of the first and second control signals, and an equalizing element connected between the first output line and the second output line for equalizing the first and second output lines in response to a third control signal. A control signal generating element generates the first, second, and third control signals, and inverted signals thereof, in response to predetermined input signals. The DC current generated from an output driver and the charging and discharging current of output loading can be reduced, to thereby reduce power consumption. Also, when the output signals are applied as enable signals of bitline sense amplifiers, an initial invalid sensing the bitline sense amplifier circuits can be avoided.

12 Claims, 3 Drawing Sheets

SIGNAL GENERATOR FOR GENERATING SENSE AMPLIFIER ENABLE SIGNAL

BACKGROUND OF THE INVENTION

1. Field of the Invention

The present invention relates to a signal generator for a semiconductor device, and more particularly, to a signal generator for generating an enable signal for enabling a bitline sense amplifier.

2. Description of the Related Art

The bitline sense amplifier of a dynamic random access memory (DRAM) amplifies a small signal difference generated across a bitline associated with a charge sharing between an accessed memory cell and the bitline. In view of the critical nature of the sense amplifier's operation, the generation of an enable signal for enabling the bitline sense amplifier is an important aspect of the DRAM.

A conventional signal generator for generating a bitline sense amplifier enable signal has the structure of a simple inverter, and slows the inclination of an output signal or enables two drivers, i.e., a driver of a P-type sense amplifier and a driver of a N-type sense amplifier, in order to prevent an initially invalid sensing from occurring.

FIG. 1 is a circuit diagram of a general data sensing circuit including a bitline sense amplifier in a DRAM.

Referring to FIG. 1, a P-type sense amplifier 1 and an N-type sense amplifier 3 are connected to a pair of bitlines BL and $\overline{BL}$ of memory arrays 5 and 7, the memory arrays 5 and 7 being adjacent to each other. Also, PMOS driver transistors P3 and P4 and NMOS driver transistors N3 and N4 are connected to the P-type sense amplifier 1 and the N-type sense amplifier 3, respectively. An enable signal LANG for enabling the N-type sense amplifier 3 is input into the gates of the NMOS driver transistors N3 and N4, and an enable signal LAPG for enabling the P-type sense amplifier 1 is input into the gates of the PMOS driver transistors P3 and P4. Reference characters N5, N6, N7 and N8 represent NMOS isolation transistors for isolating the pair of bitlines BL and $\overline{BL}$, the P-type sense amplifier 1 and the N-type sense amplifier 3, and reference characters PISOi and PISOj represent gate control signals for controlling the NMOS isolation transistors N5, N6, N7 and N8.

FIG. 2 is a circuit diagram of a conventional signal generator for generating the bitline sense amplifier enable signals LANG and LAPG applied to the driver transistors N3, N4, P3 and P4 shown in FIG. 1.

Referring to FIG. 2, the conventional signal generator for the N-type sense amplifier includes a NAND gate ND1 for receiving a control signal PNS and a memory cell block select signal BLSij, and an inverter I1 for inverting the output of the NAND gate ND1. The resultant inverted signal is output as the enable signal LANG. The signal generator for the P-type sense amplifier includes a NAND gate ND2 for receiving the control signal PPS and a memory cell block select signal BLSij, a first inverter I2 for inverting the output of the NAND gate ND1 and a second inverter I3 for inverting the output of the inverter I2. The resultant twice inverted signal is output as the enable signal LAPG.

Also, resistance R1 is connected between the PMOS transistor of the inverter I1 and a power supply VCC, and resistance R2 is connected between the NMOS transistor of the inverter I3 and a ground voltage VSS. These resistors are provided to prevent an initial invalid sensing of the bitline sense amplifier which is caused by a slow inclination of the output enable signals LANG and LAPG.

Nevertheless, the conventional signal generator for generating a bitline sense amplifier enable signal suffers drawbacks in that DC current exhaustion and initial invalid sensing of the bitline sense amplifier can still occur.

SUMMARY OF THE INVENTION

Accordingly, it is an object of the present invention to provide a signal generator which prevents an initial invalid sensing of a bitline sense amplifier, and which reduces the DC current in an output driver and the charging/discharging current associated with an output loading, to thereby reduce power consumption.

To accomplish the above and other objects of the present invention, there is provided a signal generator of a semiconductor device comprising: a first drive circuit which applies a first signal to a first output line in response to first and second control signals; a second drive circuit which applies a second signal to a second output line in response to first and second inverted control signals, said first and second inverted control signals being inverted relative to said first and second control signals; an equalizer circuit which equalizes said first and second output lines in response to a third control signal, said equalizer circuit being connected between said first and second output lines; and a control signal generator which generates said first, second, and third control signals and said first and second inverted control signals in response to predetermined first, second, and third input signals.

Preferably, the first drive circuit comprises a PMOS driving transistor and an NMOS driving transistor connected in series between a power supply voltage and a ground voltage, and wherein respective gates of said PMOS and NMOS driving transistors receive said first and second control signals, and the second drive circuit comprises a PMOS driving transistor and an NMOS driving transistor connected in series between a power supply voltage and a ground voltage, and wherein respective gates of said PMOS and NMOS transistors receive said first and second inverted control signals.

It is further preferable that the equalizer circuit comprises a transmission gate having one end connected to said first output line and another end connected to said second output line, said transmission gate being controlled by said third control signal.

It is also preferable that the control signal generator comprises: a first logic circuit which subjects said predetermined first and second input signals to a NAND operation to obtain said first control signal; a first inverter which inverts said first control signal to obtain said first inverted control signal; a second logic circuit which subjects said predetermined second and third input signals to a NAND operation to obtain said second control signal; a second inverter which inverts said second control signal to obtain said second inverted control signal; a third logic circuit which subjects said first control signal and said predetermined third input signal to an NAND operataion to obtain said third control signal; and a third inverter which inverts said third control signal to obtain a third inverted control signal, said third inverted control signal being applied to said equalizer circuit.

Accordingly, the signal generator of the present invention reduces the DC current which may be generated in the output driver and the charging/discharging current caused by the output loading, to thereby also reduce power consumption. Also, when the output signal of the signal generator is used as the enable signal of the bitline sense amplifier, an initial invalid sensing of the bitline sense amplifier can be prevented.

BRIEF DESCRIPTION OF THE DRAWINGS

The above and other objects and advantages of the present invention will become more readily apparent from the following detailed description of the preferred embodiment thereof, with reference to the attached drawings, in which.

DETAILED DESCRIPTION OF THE PREFERRED EMBODIMENT

Figure 3:
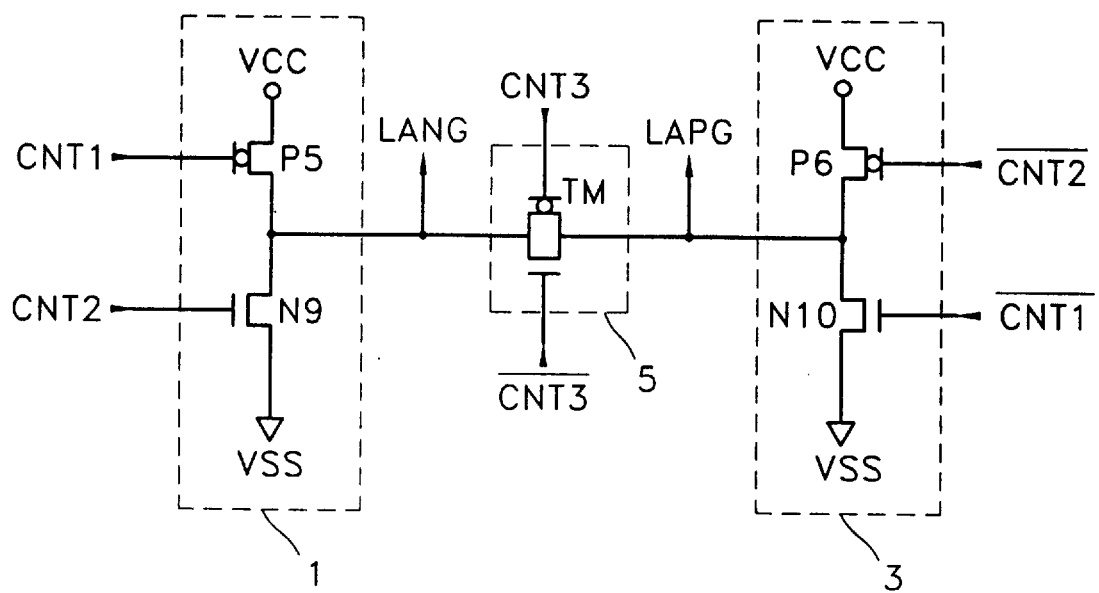
FIG. 3 is a circuit diagram of a signal generator for generating a bitline sense amplifier enable signal according to the present invention.

Referring to FIG. 3, a signal generator according to an embodiment of the present invention includes a first drive circuit 1 for signaling a first output line LANG in response to first and second control signals CNT1 and CNT2, a second drive circuit 3 for signaling a second output line LAPG in response to first and second inverted control signals $\overline{CNT1}$ and $\overline{CNT2}$, and an equalizer circuit 5 connected between the first output line LANG and the second output line LAPG and for equalizing the first and second output lines LANG and LAPG in response to a third control signal CNT3 and an inverted control signal $\overline{CNT3}$ thereof.

Here, the first drive circuit 1 includes first PMOS and NMOS driving transistors P5 and N9 connected in series between a power supply VCC and a ground voltage VSS. The respective gates of the first PMOS and NMOS driving transistors P5 and N9 are connected to the first and second control signals CNT1 and CNT2. The second drive circuit 3 includes second PMOS and NMOS driving transistors P6 and N10 connected in series between the power supply VCC and the ground voltage VSS. Here, the respective gates of the second PMOS and NMOS driving transistors P6 and N10 are connected to first and second inverted control signals $\overline{CNT1}$ and $\overline{CNT2}$. The equalizer circuit 5 includes a transmission gate TM, one end of which is connected to the first output line LANG and the other end of which is connected to the second output line LAPG. The transmission gate TM is controlled by the third control signal CNT3 and the inverted control signal $\overline{CNT3}$ thereof. Also, the signal output to the first output line LANG is the enable signal for enabling the N-type sense amplifier 3 of FIG. 1, and the signal output to the second output line LAPG is the enable signal for enabling the P-type sense amplifier 1 of FIG. 1.

Figure 4:
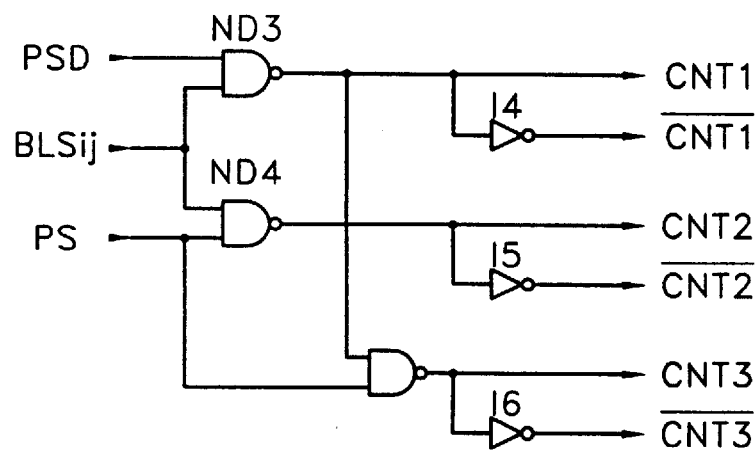
FIG. 4 is a circuit diagram of a control signal generator for generating control signals applied to the signal generator of FIG. 3.

Referring now to FIG. 4, the illustrated control signal generator includes a NAND gate ND3 which functions as a first logic circuit for subjecting predetermined first and second input signals PSD and BLSij to a NAND operation so as to output the first control signal CNT1, a first inverter 14 for inverting the first control signal CNT1 to obtain the first inverted control signal $\overline{CNT1}$, a NAND gate ND4 which functions as second logic circuit for subjecting predetermined second and third input signals BLSij and PS to a NAND operation so as to output the second control signal CNT2, a second inverter 14 for inverting the second control signal CNT2 to obtain the second inverted control signal $\overline{CNT2}$, a third NAND gate ND5 which functions as a third logic circuit for subjecting the first control signal CNT1 and the third input signal PS to an NAND operation so as to output the third control signal CNT3, and third inverter 16 for inverting the third control signal CNT3 to obtain the third inverted control signal $\overline{CNT3}$.

Figure 5:
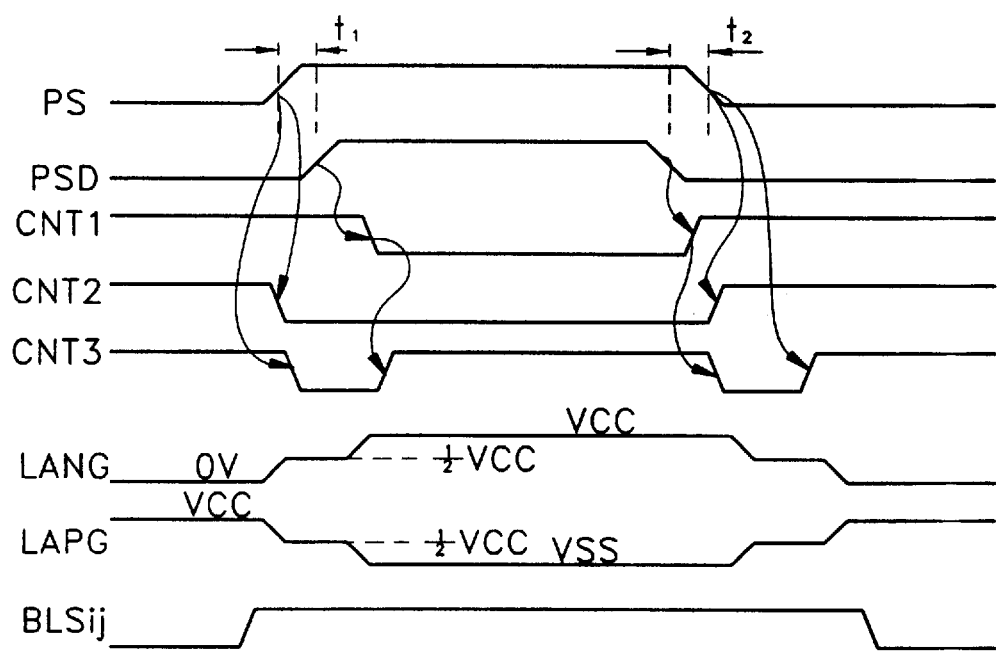
FIG. 5 is a timing diagram for explaining the operation of the circuits shown in FIGS. 3 and 4.

Referring to the timing chart of FIG. 5, when the third input signal PS is "low" and the first input signal PSD is "low", the first, second and third control signals CNT1, CNT2 and CNT3 become "high". Accordingly, the first PMOS driving transistor P5 of the first drive circuit 1 and the second NMOS driving transistor N10 of the second drive circuit 3 are turned OFF, and the first NMOS driving transistor N9 of the first drive circuit 1 and the second PMOS driving transistor P6 of the second drive circuit 3 are turned ON, and further the transmission gate TM of the equalizer circuit 5 is turned OFF. As a result, the signal initially output to the first output line LANG becomes "low" and the signal initially output to the second output line LAPG becomes "high".

Next, when the second input signal BLSij is enabled to a "high" level and the third input signal PS is enabled to a "high" level, the second control signal CNT2 becomes "low", the first control signal CNT1 is maintained as "high" and the third control signal CNT3 becomes "low". Accordingly, the first NMOS driving transistor N9 and the second PMOS driving transistor P6 are turned OFF, and further the transmission gate TM of the equalizing circuit 5 is turned ON. Here, since the first control signal CNT1 is "high", the first PMOS driving transistor P5 and the second NMOS driving transistor N10 are turned OFF. That is, three intervals concurrently exist, i.e., an interval in which the first PMOS driving transistor P5 and the first NMOS driving transistor N9 are turned, an interval in which the second PMOS driving transistor P6 and the second NMOS driving transistor N10 are turned, and an interval in which the transmission gate TM of the equalizing means is turned ON.

Here, the signal of the first output line LANG which has been initially "low" and the signal of the second output line LAPG which has been initially "high", are charge-shared, so that signals of the first and second output lines LANG and LAPG are equalized to (½)VCC. Accordingly, the bitline sense amplifiers 1 and 3 of FIG. 1 perform the initial sensing.

Figure 1:
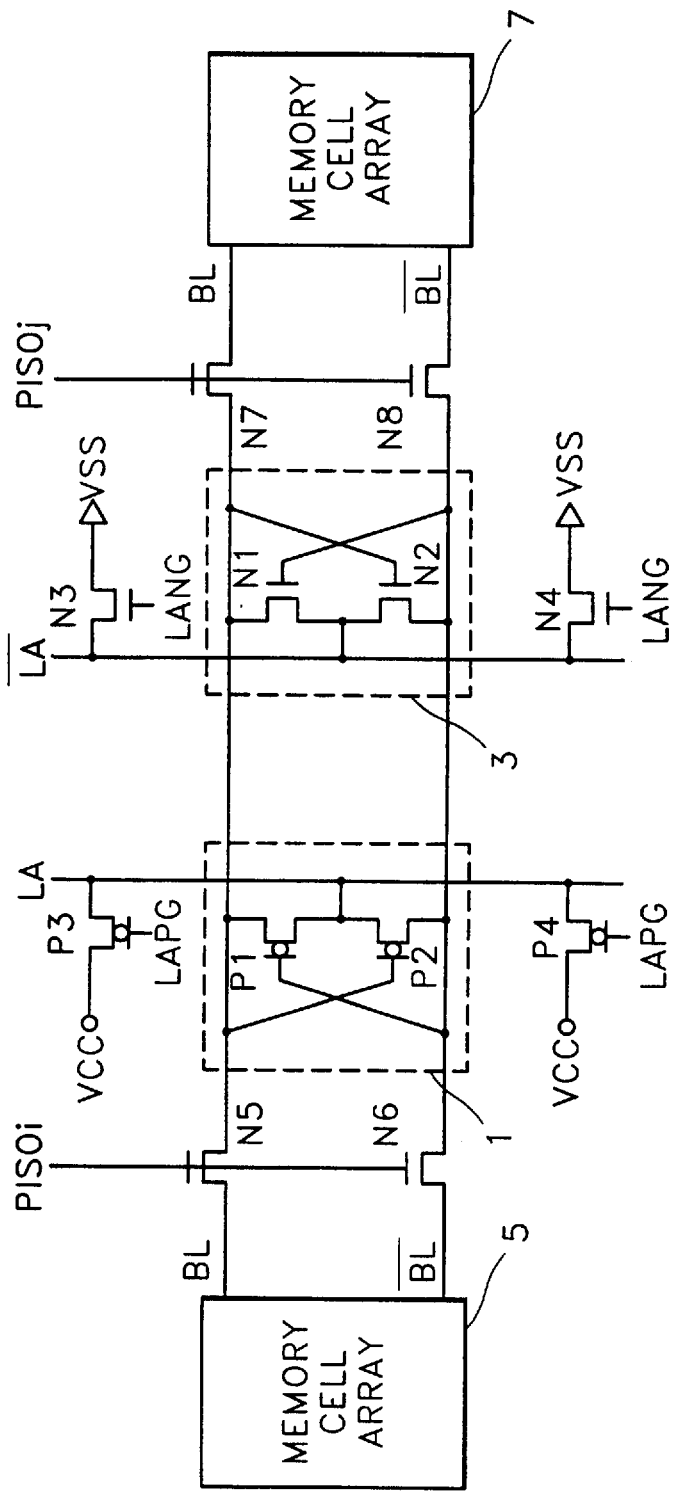
FIG. 1 is a circuit diagram of a general data sensing circuit including a bitline sense amplifier in a DRAM.
Figure 2:
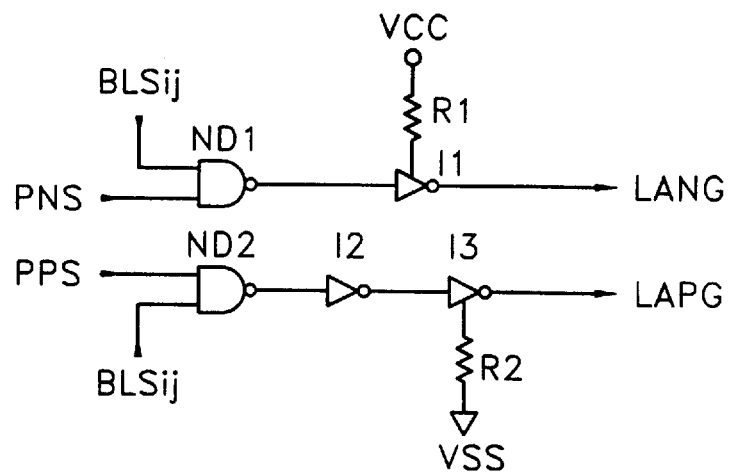
FIG. 2 is a circuit diagram of a conventional signal generator for generating a bitline sense amplifier enable signal.

When the first input signal PSD is enabled to a "high" level a predetermined period of time t1 after the third input signal PS is enabled to a "high" level, the first control signal CNT1 becomes "low" and the third control signal CNT3 becomes "high". Accordingly, the first PMOS driving transistor P5 and the second NMOS driving transistor N10 are turned ON and the transmission gate TM is turned OFF. The signal of the first output line LANG moves to "high" (i.e., the VCC level) and the signal of the second output line LAPG moves to "low" (i.e., the VSS level). As a result, the PMOS driver transistors P3 and P4 of the P-type sense amplifier 1 and the NMOS driver transistors N3 and N4 of the N-type sense amplifier 3 of FIG. 1 are sufficiently turned ON.

When the first input signal PSD becomes "low", an operation which is the same as that of the above-described period t1 is performed during the predetermined period of time t2 until the third input signal PS becomes "low", to thereby generate charge sharing and further to equalize the first output line (LANG) signal and the second output line (LAPG) signal to (½)VCC.

When the third input signal PS becomes "low" a predetermined period of time t2 after the first input signal PSD becomes "low", the first, second and third control signals CNT1, CNT2 and CNT3 become "high". Accordingly, the first PMOS driving transistor P5 and the second NMOS transistor N10 are turned OFF, and the first NMOS driving transistor N9 and the second PMOS driving transistor P6 are turned ON, and the transmission gate TM is turned OFF. Here, the signal of the first output line LANG becomes "low" as in the initial state, and the signal of the second output line LAPG becomes "high", and the sensing operation of the bitline sense amplifiers 1 and 3 of FIG. 1 is completed. As a result, due to the enabling and disabling time differences t1 and t2 between the third input signal PS and the first input signal PSD, the first PMOS driving transistor P5 and the first NMOS driving transistor N9, or the second PMOS driving transistor P6 and the second NMOS driving transistor N10, are not concurrently turned ON and a DC current is not generated.

Accordingly, the signal generator of the present invention reduces the DC current which may be generated in the output driver and the charging/discharging current caused by the output loading, to thereby also reduce power consumption. Also, when the output signal of the signal generator is used as the enable signal of the bitline sense amplifier, an initial invalid sensing of the bitline sense amplifier can be prevented.

It should be understood that the invention is not limited to the illustrated embodiment, and that many changes and modifications will be readily contemplated by those skilled in the art and yet still fall within the scope of the invention as defined by the appended claims.

What is claimed is:

1. A signal generator of a semiconductor device, comprising:
    a first drive circuit which applies a first signal to a first output line in response to first and second control signals;
    a second drive circuit which applies a second signal to a second output line in response to first and second inverted control signals, said first and second inverted control signals being inverted relative to said first and second control signals;
    an equalizer circuit which equalizes said first and second output lines in response to a third control signal, said equalizer circuit being connected between said first and second output lines; and
    a control signal generator which generates said first, second, and third control signals and said first and second inverted control signals in response to predetermined first, second, and third input signals.

2. A signal generator of a semiconductor device according to claim 1, wherein said first drive circuit comprises a PMOS driving transistor and an NMOS driving transistor connected in series between a power supply voltage and a ground voltage, and wherein respective gates of said PMOS and NMOS driving transistors receive said first and second control signals.

3. A signal generator of a semiconductor device according to claim 1, wherein said second drive circuit comprises a PMOS driving transistor and an NMOS driving transistor connected in series between a power supply voltage and a ground voltage, and wherein respective gates of said PMOS and NMOS transistors receive said first and second inverted control signals.

4. A signal generator of a semiconductor device according to claim 1, wherein said equalizer circuit comprises a transmission gate having one end connected to said first output line and another end connected to said second output line, said transmission gate being controlled by said third control signal.

5. A signal generator of a semiconductor device according to claim 1, wherein said control signal generator comprises:
    a first logic circuit which subjects said predetermined first and second input signals to a NAND operation to obtain said first control signal;
    a first inverter which inverts said first control signal to obtain said first inverted control signal;
    a second logic circuit which subjects said predetermined second and third input signals to a NAND operation to obtain said second control signal;
    a second inverter which inverts said second control signal to obtain said second inverted control signal;
    a third logic circuit which subjects said first control signal and said predetermined third input signal to an NAND operataion to obtain said third control signal; and
    a third inverter which inverts said third control signal to obtain a third inverted control signal, said third inverted control signal being applied to said equalizer circuit.

6. A signal generator of a semiconductor device according to claim 5, wherein said predetermined first input signal is enabled to a "high" level a predetermined period of time after said predetermined third input signal is enabled to a "high" level, and is disabled to a "low" level a predetermined period of time before said third input signal is disabled to a "low" level.

7. A signal generator of a semiconductor device according to claim 1, wherein said first and second signals from said first and second output lines are enable signals of respective first and second bitline sense amplifiers of a semiconductor memory.

8. A signal generator of a semiconductor device according to claim 2, wherein said first and second signals from said first and second output lines are enable signals of respective first and second bitline sense amplifiers of a semiconductor memory.

9. A signal generator of a semiconductor device according to claim 3, wherein said first and second signals from said first and second output lines are enable signals of respective first and second bitline sense amplifiers of a semiconductor memory.

10. A signal generator of a semiconductor device according to claim 4, wherein said first and second signals from said first and second output lines are enable signals of respective first and second bitline sense amplifiers of a semiconductor memory.

11. A signal generator of a semiconductor device according to claim 5, wherein said first and second signals from said first and second output lines are enable signals of respective first and second bitline sense amplifiers of a semiconductor memory.

12. A signal generator of a semiconductor device according to claim 6, wherein said first and second signals from said first and second output lines are enable signals of respective first and second bitline sense amplifiers of a semiconductor memory.

* * * * *